United States Patent [19]

Fontana et al.

[11] Patent Number: 4,999,743

[45] Date of Patent: Mar. 12, 1991

[54] TRANSFORMER WITH INCLUDED CURRENT SENSING ELEMENT

[75] Inventors: Edward C. Fontana, Dallas, Tex.; John S. Rucki, Hillside, N.J.

[73] Assignee: AT&T Bell Laboratories, Murray Hill, N.J.

[21] Appl. No.: 413,570

[22] Filed: Sep. 27, 1989

[51] Int. Cl.[5] ........................ H05K 7/02; H01F 27/30

[52] U.S. Cl. .................................... 361/400; 336/174; 336/192; 336/198

[58] Field of Search ........................ 361/42, 44, 45, 43, 361/392, 394, 395, 399, 400, 405, 417, 419; 336/192, 198, 208, 174, 175, 136, 65

[56] References Cited

U.S. PATENT DOCUMENTS

| | | | |
|---|---|---|---|
| 3,593,245 | 4/1969 | Iwata | 336/136 X |
| 3,601,734 | 8/1971 | Chesney | 336/136 X |
| 4,507,709 | 3/1985 | Morris et al. | 361/395 X |
| 4,641,216 | 2/1987 | Morris et al. | 336/174 X |

FOREIGN PATENT DOCUMENTS

| | | | |
|---|---|---|---|
| 62-125608 | 6/1987 | Japan | 336/192 |

OTHER PUBLICATIONS

"Tab Pin Protector," Sorben, IBM Technical Disclosure Bulletin, vol. 24, No. 11B, 4/82, p. 6166.

*Primary Examiner*—Thomas J. Kozma
*Attorney, Agent, or Firm*—A. G. Steinmetz

[57] ABSTRACT

A current sensing element is included as an integral part of a magnetic component by mounting a toroidal magnetic core having a current sensing winding into a receptacle of a winding bobbin of the magnetic component. This eliminates a need for a separate board mounted current sensing winding thereby saving circuit board space and reducing overall parts count on the circuit board, and circuit assembly costs.

10 Claims, 6 Drawing Sheets

TRANSFORMER WITH INCLUDED CURRENT SENSING ELEMENT

FIELD OF THE INVENTION

This invention relates to the construction of magnetic components and in particular to an arrangement for facilitiating sensing of current flow in a winding of the magnetic component.

BACKGROUND OF THE INVENTION

It is often desirable or necessary to monitor the current flow in a magnetic component winding, such as a transformer winding, for alarm or control functions. Such monitoring is frequently accomplished by means of magnetic coupling in order to eliminate the power dissipation incurred in sensing the current with a series resistive element. In one fairly common arragement, the winding whose current is to be monitored has one of its terminal ends threaded through a toroidal magnetic core having a current sensing toroid winding.

In the prior art the toroidal magnetic core with its current sensing toroid winding was mounted external to the periphery of the magnetic component and was either allowed to loosely dangle secured in place only by its electrical connections or was independently mechanically secured to the circuit board to which the magnetic component likewise was secured. This act of mechanically securing the toroidal core to the circuit board required a separate mounting operation to add the sensing device and to connect the leads of the sensing device to the associated sensing circuitry. These operations add considerable cost to the overall circuit assembly process. Frequently the addition of this current sensing device in the prior art incurred a separate hand insertion and mounting of the device on the circuit board.

The existence of the toroidal mangetic core outside of the periphery of the magnetic component further unnecessarily comsumed board mounting space. In some instances where the entire board is potted the potting operation automatically secured the toroid to the ciruict board, and the attachement of the sensing device to the board was therefore simplified. However the sensing leads still needed hand attachment and in addition the sensing device was still outside of the periphery of the magnetic componet.

SUMMARY OF THE INVENTION

The current sensing element for determining a magnetic component (transformer or inductor) winding current has been included into the structure of the magnetic component which may be a power inductor or a transformer component. This eliminates a need for a separate board mounted current sensing winding thereby eliminating a separate mounting opertion, saving board space and reducing parts count on the board.

In one particular embodiment of the invention a current sensing element is included as an integral part of a mangetic component by mounting a toroidal magnetic core, having a current sensing toroid winding, into a receptacle or cavity of a winding bobbin of the magnetic component. The winding whose current is to be sensed is threaded through the central aperture of the toroidal magnetic core within the receptacle in which it is mounted in order to secure the toroidal core within the receptacle. The winding bobbin further includes output terminals connected to the terminal ends of the toroid windling in order to permit accessibility and automated connection to the voltage developed across the toroid winding.

This arrangement advantageously reduces circuit assembly costs and also provides a structure that readily meets safety agency requirements. (LE, VDE, UL, CSA,etc.)

BRIEF DESCRIPTION OF THE DRAWING

In the Drawing:

FIGS. 1,2,3 and 4 are othographic projections of a bobbin structure emboding the principles of the invention; wherein:

FIG. 1 is a frontal view of the bobbin structure;

FIG. 2 is a top view of the bobbin structure;

FIG. 3 is a side view of the bobbin structure; and

FIG. 4 is a bottom view of the bobbin structure with the winding and current sensing device added to the view;

DETAILED DESCRIPTION

Figure 1:
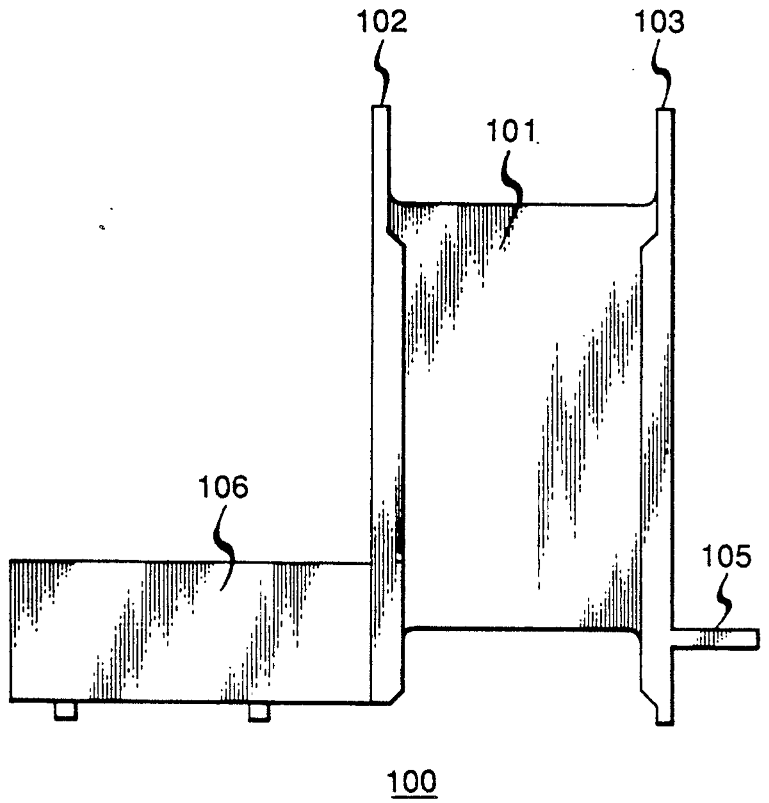
Figure 2:
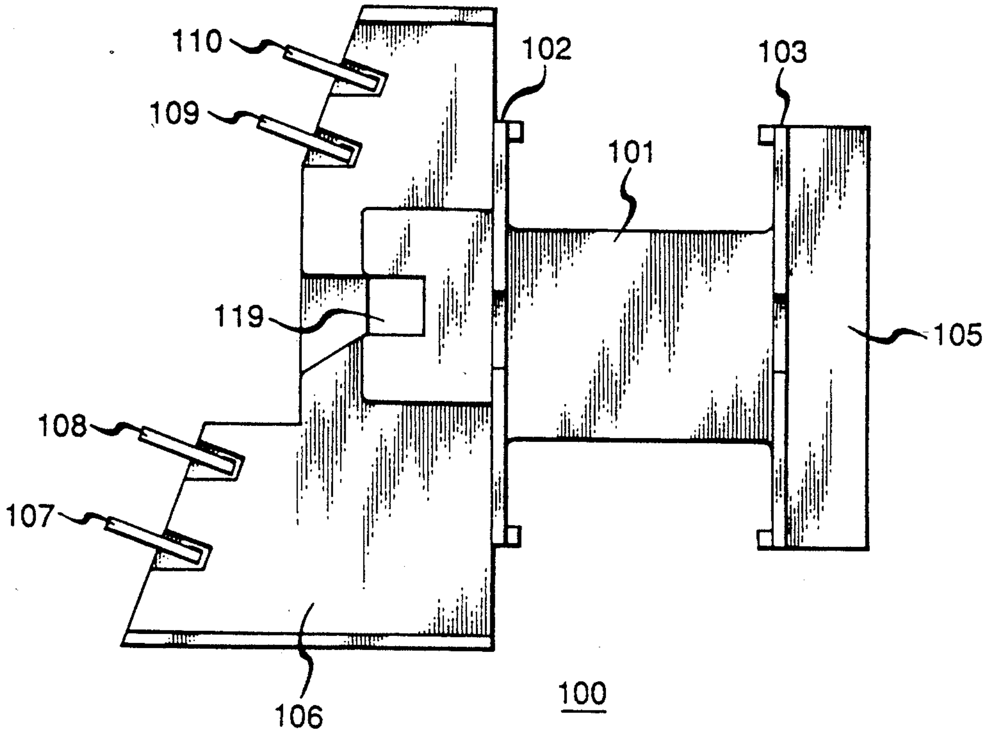
Figure 3:
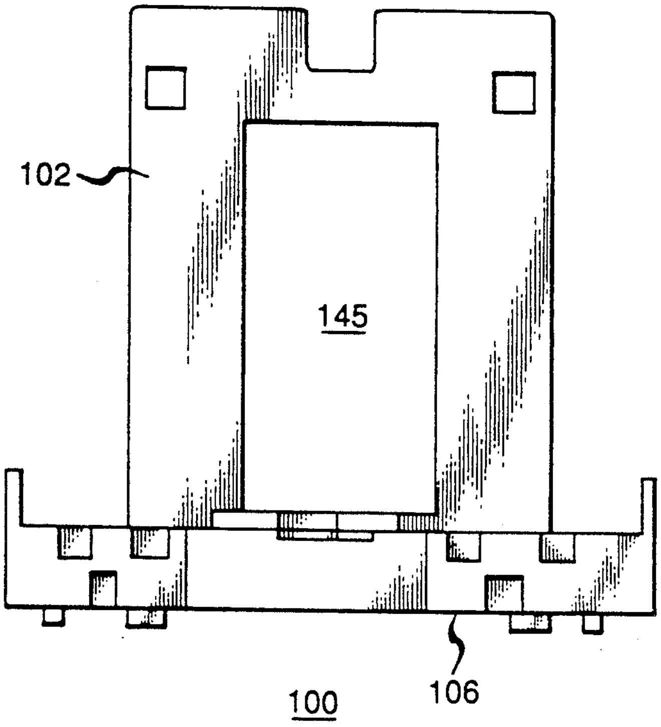

A frontal view of a bobbin structure is shown in FIG. 1. Its top view is shown in FIG. 2, a side view in FIG. 3 and its bottom view in FIG. 4. The overall bobbin structure 100 has a main wire winding support member 101 having wire retaining flanges 102 and 103 on either side of the winding support member 101. A narrow horizontal structural ledge member 105 is attached to the bottom of flange 103. A larger horizontal structural and pin-out member 106 is connected to the left hand flange 102.

A bobbin aperature 145 passing through the center of the main winding support member 101 is provided for mounting of the magnetic core of the magnetic component in and around the magnetic winding 130 of the component. This magnetic component core may be an E—E core, for example, with the central leg of the magnetic component core passing through bobbin aperture 145. Other magnetic component core arrangements will readily suggest themselves to those skilled in the art.

Figure 4:
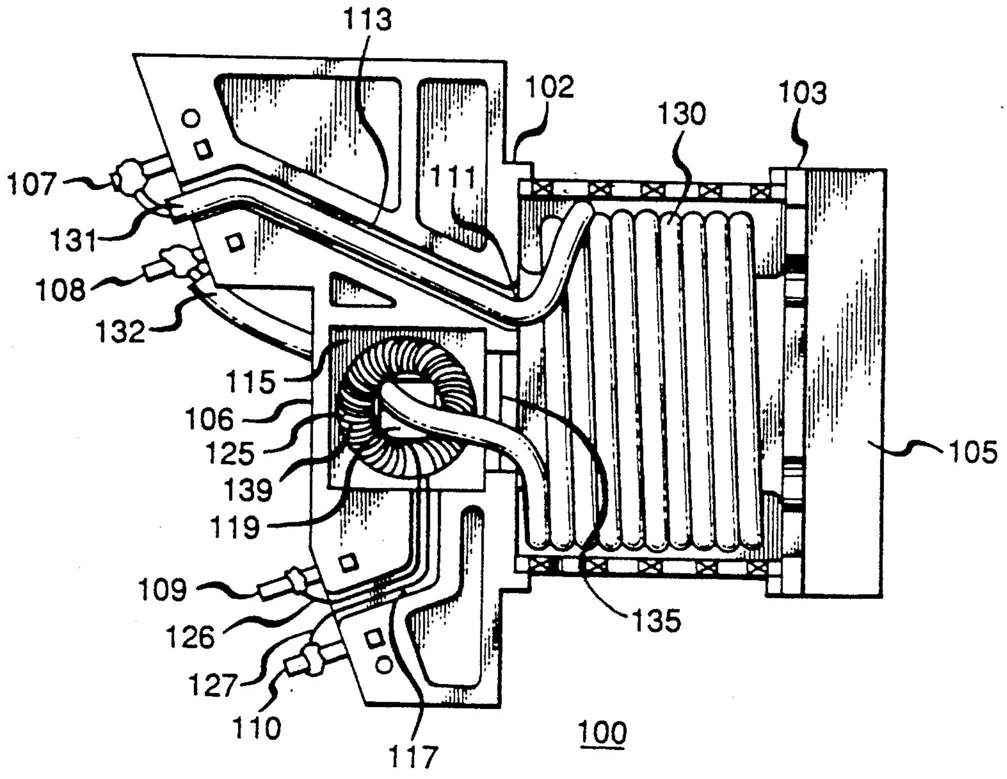

The horizontal structural and pinout member 106 includes a first pair of pinout terminal pins 107 and 108 on its periphery for connection to the winding 130 wound on winding support member 101. An additional pair of pinout terminals 109 and 110 on its periphery are provided for access to a sensing toroid winding 139 used to sense a current magnitude on the magnetic component winding 130 wound on the winding support member 101. Several cavities and channels are moulded into the under side of the horizontal structural and pinout member 106 as shown in FIG. 4. A notch 111 cut through the flange 102 is provided so that a first end 131 of a winding 130 wound on the main wire winding support member 101 can pass through this notch 111 and through a channel 113 moulded in the underside of the horizontal structural and pinout member 106 to the pinout terminal 107.

A rectangular receptacle or cavity 115 is moulded into the underside of the horizontal structural and pinout member 106 as a receptacle for a current sensing toroidal magnetic core 125 having a current sensing winding 139 wound thereupon. A second 132 end of the component windling 130 wound on the main wire winding support member 101 passes through a notch 135 cut into the flange 102 to permit its passage into the rectangular cavity 115. It is threaded through the central aperture of the toroidal core 125. This second end 132 of the winding subsequently passes through an aperture 119 cut through a top surface of the horizontal structural and pinout member 106 and from thence to the pinout terminal 108.

The second end 132 of the winding securely holds the toroidal core 125 with its toroid winding 139 within the confines of the rectangular aperture 115.

A channel 117 is provided for passage of the terminal ends of the current sensing toroid winding 139 wound on the toroidal core 125, which is mounted in the rectangular cavity 115, to the pinout terminals 109 and 110. The two terminal ends 126 and 127 of this winding pass through the channel 117 and are connected to pinout terminals 109 and 110, respectively.

Terminating the terminal ends of the component and toroid windings on the pinout terminals 107–110 greatly facilitates electrical connections to these windings in the mounting of the magnetic component on the circuit board.

Figure 5:
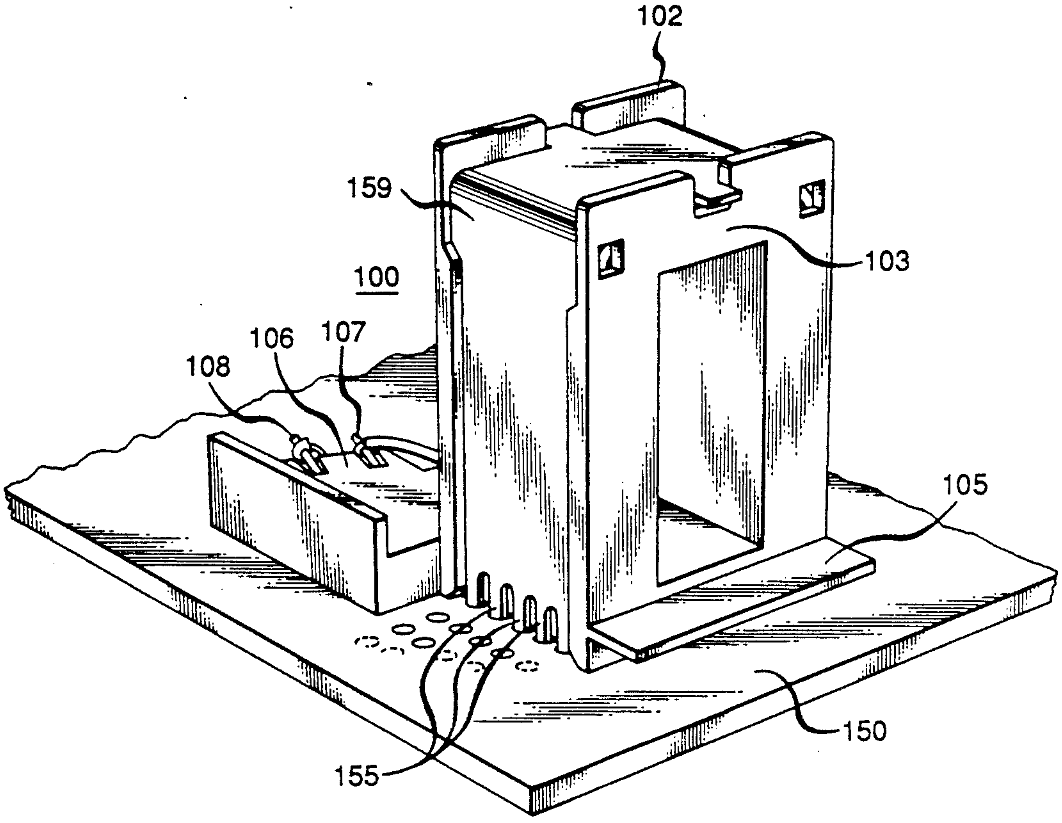
FIG. 5 is a pictorial view of a magnetic component utilizing the bobbin structure of the FIGS. 1,2,3, and 4 as mounted on a printed circuit board.

The bobbin structure 100 is shown mounted on a circuit board or circuit support 150 in FIG. 5. Such board or support 150 may be a printed circuit board or a circuit chassis. As shown, the pinout terminals (107 and 108 are visible) are readily available for connection to the circuit board or to other componets. The mounting is effected by prongs 155 of metal high current secondary winding of the transformer 159 mounted over the component winding. The secondary winding is a "U" shaped stamped single turn winding.

Figure 6:
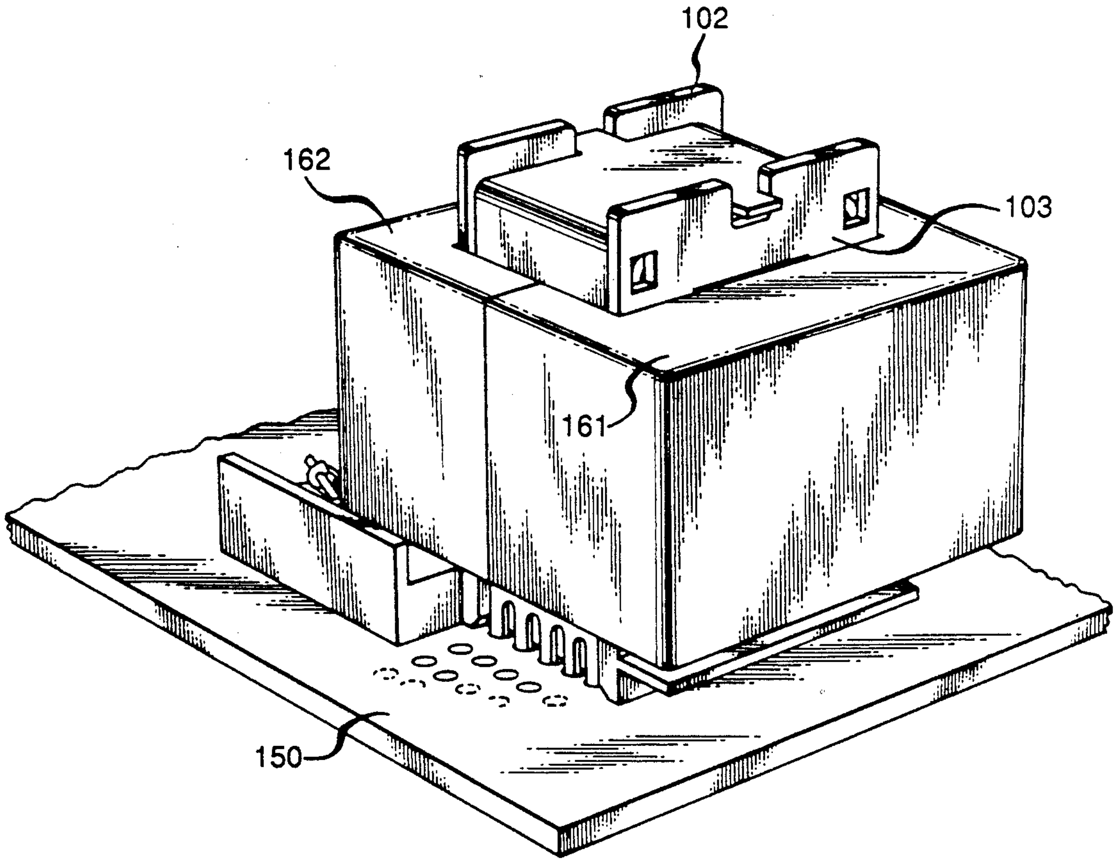
FIG. 6 is a pictorial view with a magnetic core attached to the bobbin structure.

The addition of an E—E magnetic core, comprising first and second E magnetic core components 161 and 162, is illustrated in the FIG. 6. These two E core components may be secured together by adhesives or by clamping means secured about the periphery of the magnetic core component as desired.

Figure 7:
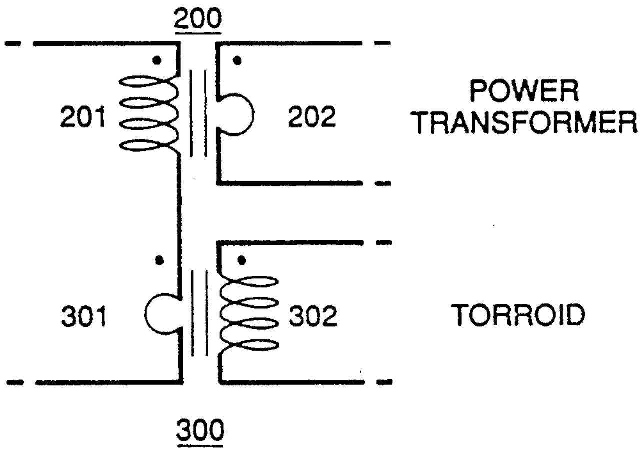
FIG. 7 is an electrical schematic of the illustrative magnetic component.

A schematic of the illustrative magnetic component is shown in FIG. 7. This component includes a power transformer 200 and a current sensing transformer 300 in one uniform structure. The main transformer 200 includes a primary winding 201 and a single turn stamped "U" shaped secondary winding 202. One end of the primary winding (i.e. lead 132 in FIG. 4) passes through the aperture of the toroidal core of transformer 300 and is a single turn winding 301. The toroid winding is the secondary winding 302.

We claim:

1. A circuit assembly comprising:

a circuit board for accepting mounting of circuit components;

a magnetic component mounted on said circuit board, including;

a bobbin structure for supporting a winding and having apparatus for facilitating mounting of the bobbin structure on the ciruict board;

a component winding wound on said bobbin structure;

a sensing device comprising a magnetic core magnetically coupled to a lead of said component winding by having the lead pass through an aperture in the magnetic core and operative for sensing a current flow in said component winding;

the bobbin structure further having a cavity, positioned apart from the winding, for accepting the sensing device as an integral part of the magnetic component, and further having electrical terminal means on an external periphery of the bobbin structure for accessing signals generated by the sensing

2. A circuit assembly, as claimed in claim 1 wherein the bobbin includes an offset base structure, and the cavity comprises a compartment built into an underside of the offset base structure; and the sensing device is inserted into the compartment.

3. A circuit assembly, as claimed in claim 2 wherein the sensing device comprises a sensing transformer with the magnetic core comprising a toroidal magnetic core and a sensing winding wound on the toroidal magnetic core and an end poriton of the component winding passing through a central aperture of the toroidal magnetic core.

4. A circuit assembly, as claimed in claim 3 wherein a passageway is provided for ends of the sensing winding to join the electrical terminal means on an external periphery of the bobbin structure.

5. A circuit assembly, comprising:

a supporting apparatus for accepting circuit components;

a magnetic component having a winding; a magnetic core and a bobbin for supporting the magnetic core and the winding;

the magnetic component mounted on the supporting apparatus and including;

a current sensing element for sensing a current in the winding and included as a component part of a structure of the magnetic component by being mounted into a cavity of the bobbin located apart from the magnetic core.

6. A circuit assembly, comprising:

a circuit support;

a magnetic component having a winding and further having a magnetic current sensing device and being mounted on the circuit support, and including;

a bobbin having a wire winding support bounded by first and second flanges, a base member secured to the first flange having first and second pairs of electrical terminals mounted at an external periphery, a cavity formed into an underside of the base member and containi the magnetic current sensing device having a wire aperture for allowing passage of a terminal end of the winding to a top surface of the base member, an opening in the first flange for allowing the terminal end of the winding access to the cavity, an aperture in the cavity for allowing passage of the terminal end of the winding ot one of the first pairs of electrical terminals.

7. A circuit assembly as claimed in claim 6, wherein:

a channel interconnects the cavity and the second pair of terminals for permitting ends of a winding of the magnetic current sensing device to connect with the second pair of terminals.

8. A circuit assembly as claimed in claim 7, wherein:

the bobbin includes a core aperture for accepting a core of magnetic material within the winding wound on the wire winding support.

9. A circuit assembly as claimed in claim 8, wherein:

the base member includes a second channel in its underside for allowing passage of a second terminal end of the winding to another one of the first pairs of electrical terminals.

10. A circuit assembly, comprising:

a circuit board for accepting mounting of circuit components;

a magnetic component mounted on said circuit board, including;

a bobbin structure for supporting a winding and having a base member for facilitating mounting of the bobbin structure on the circuit board;

electrical terminal means on an external periphery of the base member of the bobbin structure:

a sensing transformer having a toroidal magnetic cord and a sensing winding wound on the toroidal magnetic core and an end portion of the component winding passing through a central aperture of the toroidal magnetic core as a second winding;

the base member of the bobbin structure further having an offset portion with a cavity built into its under side for accepting the sensing transformer as an attached part of the magnetic component, and further including a passageway provided for ends of the sensing winding to join the electrical terminal means on an external periphery of the bobbin structure for accessing signals generated by the sensing transformer.

* * * * *